(12) United States Patent
Nadot et al.

(10) Patent No.: US 6,563,723 B2
(45) Date of Patent: May 13, 2003

(54) FAULT TOLERANT POWER SUPPLY CIRCUIT

(75) Inventors: Vladimir V. Nadot, Voorhees, NJ (US); Oleg S. Fishman, Maple Glen, PA (US)

(73) Assignee: Inductotherm Corp., Rancocas, NJ (US)

( * ) Notice: Subject to any disclaimer, the term of this patent is extended or adjusted under 35 U.S.C. 154(b) by 0 days.

(21) Appl. No.: 10/217,082

(22) Filed: Aug. 12, 2002

(65) Prior Publication Data

US 2003/0021131 A1 Jan. 30, 2003

Related U.S. Application Data

(60) Provisional application No. 60/311,822, filed on Aug. 13, 2001.

(51) Int. Cl.[7] .................. H02H 7/122; H02M 3/315; H02M 7/515
(52) U.S. Cl. .................. 363/57; 363/58; 363/28; 363/135; 363/136
(58) Field of Search .................. 363/57, 58, 27, 363/135, 136, 96

(56) References Cited

U.S. PATENT DOCUMENTS

| 4,570,212 A | * | 2/1986 | Edwards et al. ............ 363/138 |
| 4,922,401 A | * | 5/1990 | Lipman ...................... 363/58 |
| 5,027,264 A | * | 6/1991 | DeDoncker et al. .......... 363/16 |
| 5,047,913 A | * | 9/1991 | De Doncker et al. ......... 363/95 |

* cited by examiner

*Primary Examiner*—Bao Q. Vu
(74) *Attorney, Agent, or Firm*—Philip O. Post

(57) ABSTRACT

A fault current tolerant power supply circuit having a dc power source and switching devices for inverting dc current from the source into ac load current includes a protective circuit for protecting the switching devices from overvoltage conditions when an inductive load is short-circuited. The protective circuit uses a capacitive component to absorb charge during a short circuit to protect non-conducting switching devices from an overvoltage condition.

20 Claims, 11 Drawing Sheets

FAULT TOLERANT POWER SUPPLY CIRCUIT

CROSS REFERENCE TO RELATED APPLICATIONS

This application claims the benefit of U.S. Provisional Application No. 60/311,822, filed Aug. 13, 2001.

FIELD OF THE INVENTION

The present invention relates to a power supply circuit that is of particular use for providing ac current to inductive loads as used, for example, in induction heating or melting applications wherein the inductive load may be subject to a short circuit that can produce, depending upon the topology of the supply, a high level of fault voltage across, or fault current through, switching devices used in the supply.

BACKGROUND OF THE INVENTION

A conventional series-resonant dc-to-ac inverter power supply circuit for an induction furnace, or other load having a substantially inductive impedance, includes a dc power source and an inverter having one or more pairs of series-connected switch circuits. Each switch circuit comprises a series combination of an inductive reactor and switching device, such as a silicon-controlled rectifier (SCR), with an antiparallel diode connected across the switching device. The inductive reactor limits the rate of change of current over time through its associated SCR when it turns-on (commutates) and, consequently, is referred to as a di/dt reactor. The inverter's SCRs are connected to an inductive load, such as an induction coil, and are alternatively gated (triggered) to switch between the non-conducting and conducting states. With this arrangement, each SCR in a pair of SCRs alternately allows current to flow through the induction coil in opposing directions, thus establishing an ac current flow through the coil.

Parallel-resonant dc-to-ac inverter power supply circuits are also used with inductive loads. However, series-resonant dc-to-ac inverter power supplies are preferred because of their superior controllability. Series-resonant dc-to-ac inverter power supplies are susceptible to short circuits in the inductive load. For example, when the load is an induction coil used in an electric induction furnace for metal melting, it is not unusual for spilled molten metal, or scrap metal being loaded into the furnace, to come into contact with the coil and cause at least a partial short circuit between two or more of the coil turns. The resulting instantaneous over-voltage condition across a non-conducting switching device in the inverter at the time of the short circuit can degrade or destroy the device. A known solution to the problem is to trigger the non-conducting switching device into conduction to eliminate the over-voltage condition across the device. However, a disadvantage of this approach is that it causes extremely high current to flow through the switching device which, in turn, generates significant heat in the device over a very short period of time. The switching devices are, in effect, forced to withstand the extremely high current in order to avoid being subjected to the over-voltage condition. The result of subjecting the switching device to these high current levels is degradation of the device and premature failure.

A solution to this problem is disclosed in U.S. Pat. No. 6,038,157. This patent teaches over-voltage protection of switching devices by adding a protective inductor in series with the load induction coil as illustrated in attached FIG. 1. Circuit 110 includes a dc power source comprising a rectifier bridge circuit 120 (shown diagrammatically), series filter inductor 174 and parallel filter capacitor 172, and two solid state switching device 130, arranged in inverse parallel configuration. Each switching device has one terminal connected to an output bus of the dc power source. Antiparallel diode 132 is connected across each switching device. A suitable, but non-limiting, switching device is a gate-controlled semiconductor device, such as an SCR. A di/dt reactor 140 is connected in series between the pair of switching devices as shown in FIG. 1. Protective coil 150 has a first terminal connected to the approximate electrical midpoint of di/dt reactor 140, and a second terminal connected to a first terminal of load induction coil 160. The second terminal of load induction coil 160 is connected to the common connection between two series-connected commutation or tank capacitors 170 which, in series combination, are connected across the output buses of the dc power source. In an induction metal melting application, load induction coil 160 is typically wound around the exterior of the heating crucible. Direct current supplied from the power source is positively and negatively switched through switching devices 130 to supply an ac current to load induction coil 160. The current flowing through coil 160 generates a magnetic field that inductively couples with a metal load in the crucible. The magnetic field induces an eddy current in the metal load that heats the metal. Since protective coil 150 continuously carries full load current, it generates significant power losses that decrease the overall efficiency of the power supply circuit. Furthermore the losses increase with the switching frequency of the supply. In the event of a short circuit in load induction coil 160, the voltage applied to switching devices 130 is reduced by a voltage dividing circuit that comprises protective coil 150 and di/dt reactor 140.

The present invention solves the problem of premature failures of the switching devices from exposure to over-voltage conditions resulting from short circuits in the load induction coil without penalizing circuit efficiency under normal operation, and without subjecting the switching devices to high level of currents to avoid the over-voltage.

BRIEF SUMMARY OF THE INVENTION

In one aspect, the present invention is a fault tolerant power supply circuit for an inductive load that protects sensitive power switching devices from excessive over-voltage conditions by straddling a pair of switching devices in the leg of an inverter circuit with a protective capacitive element. The protective capacitive element suppresses an over-voltage that would otherwise be applied across the switching devices in the event that a short circuit occurs in the load circuit.

In another aspect, the present invention is a fault tolerant power supply circuit that comprises a protective circuit for preventing the voltage across a non-conducting switching device from exceeding the peak allowable voltage of the non-conducting switching device during a short circuit in an inductive load. The protective circuit comprises a series connected blocking diode and protective capacitor, and a discharge resistor. The series combination of the blocking diode and protective capacitor is connected across the series combination of a pair of switch circuits. Each switch circuit comprises a switching device connected anti-parallel to an antiparallel diode. The discharge resistor may be connected across the protective capacitor or between the common connection of the series connected blocking diode and the protective capacitor, and the positive dc bus. A protective circuit can be used for each pair of switch circuits in power supplies with multiple pairs of switch circuits, such as full-bridge inverters.

In another aspect, the present invention is a fault tolerant power supply circuit that comprises a protective circuit for preventing the voltage across a non-conducting switching device from exceeding the peak allowable voltage of the non-conducting switching device during a short circuit in an inductive load. The protective circuit also clamps voltage overshoots across a switching device when an antiparallel diode transitions to reverse bias. The protective circuit comprises a series connected blocking diode and protective capacitor, and a series connected discharge resistor and choke. The discharge resistor is connected between the common connection of the series connected blocking diode and the protective capacitor, and the positive dc bus via the choke. A protective circuit can be used for each pair of switch circuits in power supplies with multiple pairs of switch circuits, such as full-bridge inverters.

Other aspects of the invention are set forth in this specification and the appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF THE INVENTION

Figure 1:
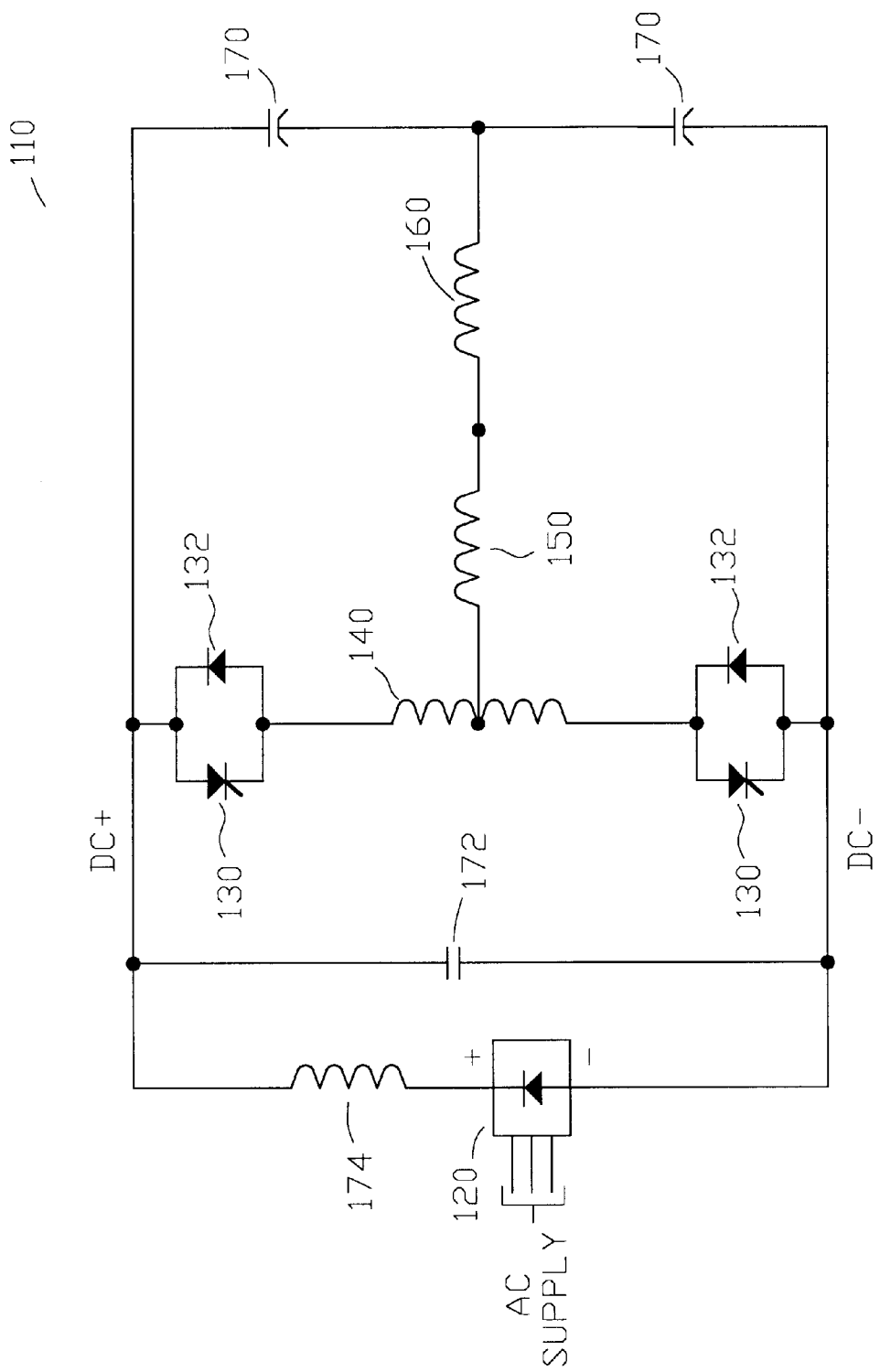
FIG. 1 is a simplified schematic diagram of a prior art fault tolerant power supply circuit.
Figure 2A:
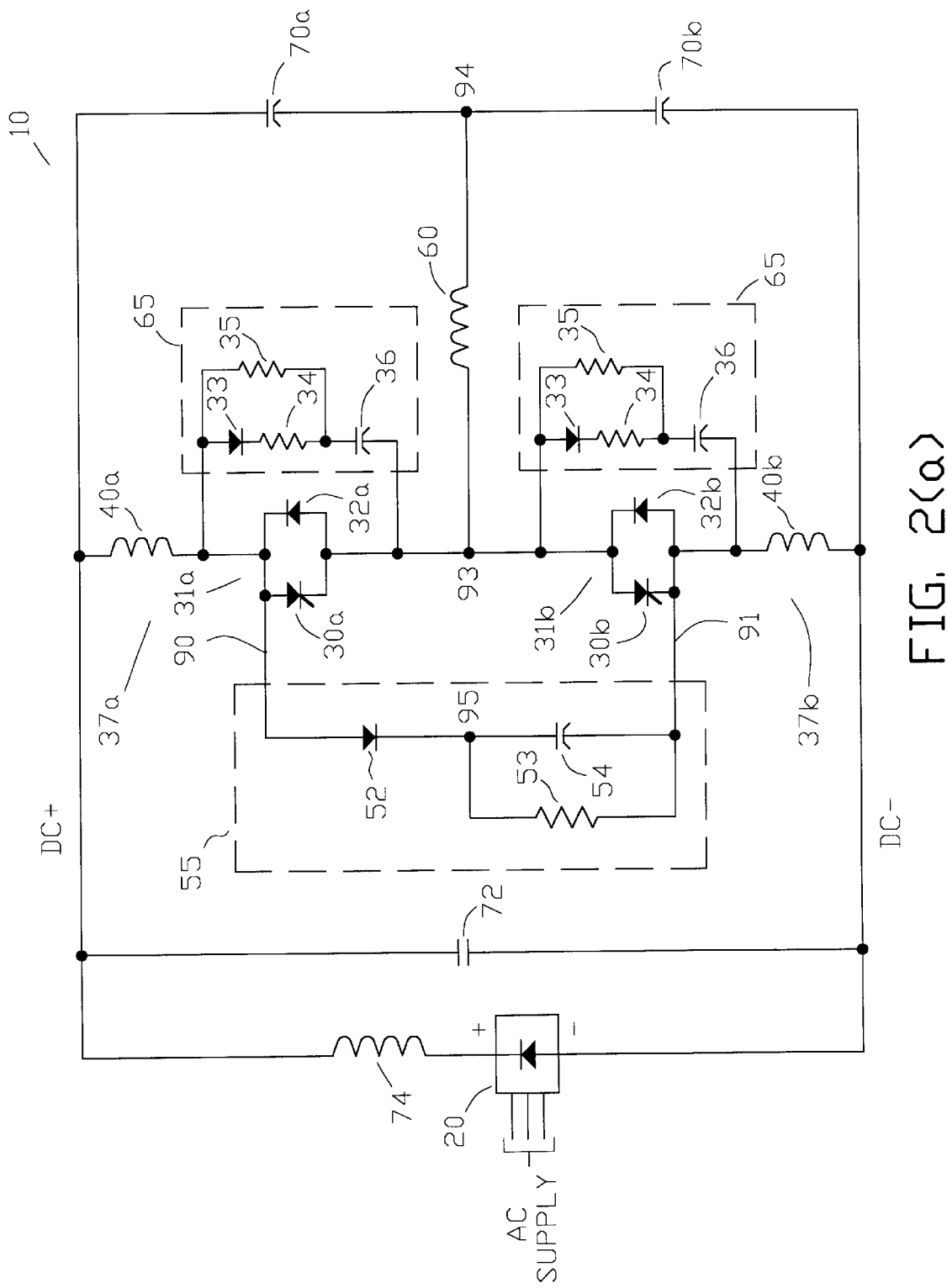
FIG. 2(a) is a simplified schematic diagram of one example of the fault tolerant power supply circuit of the present invention wherein a half-bridge inverter is used.
Figure 2B:
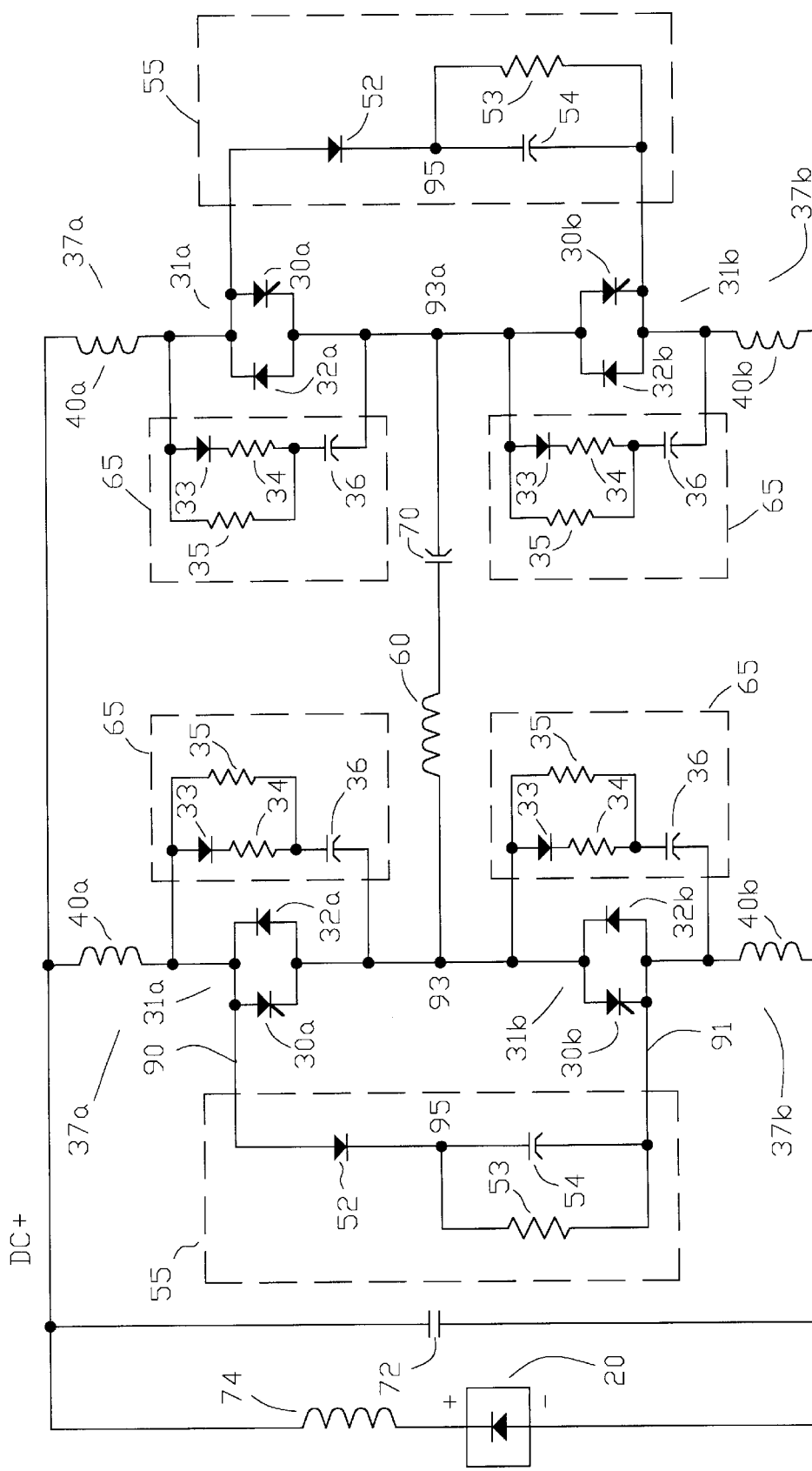
FIG. 2(b) is a simplified schematic diagram of another example of the fault tolerant power supply circuit of the present invention wherein a full-bridge inverter is used.
Figure 2C:
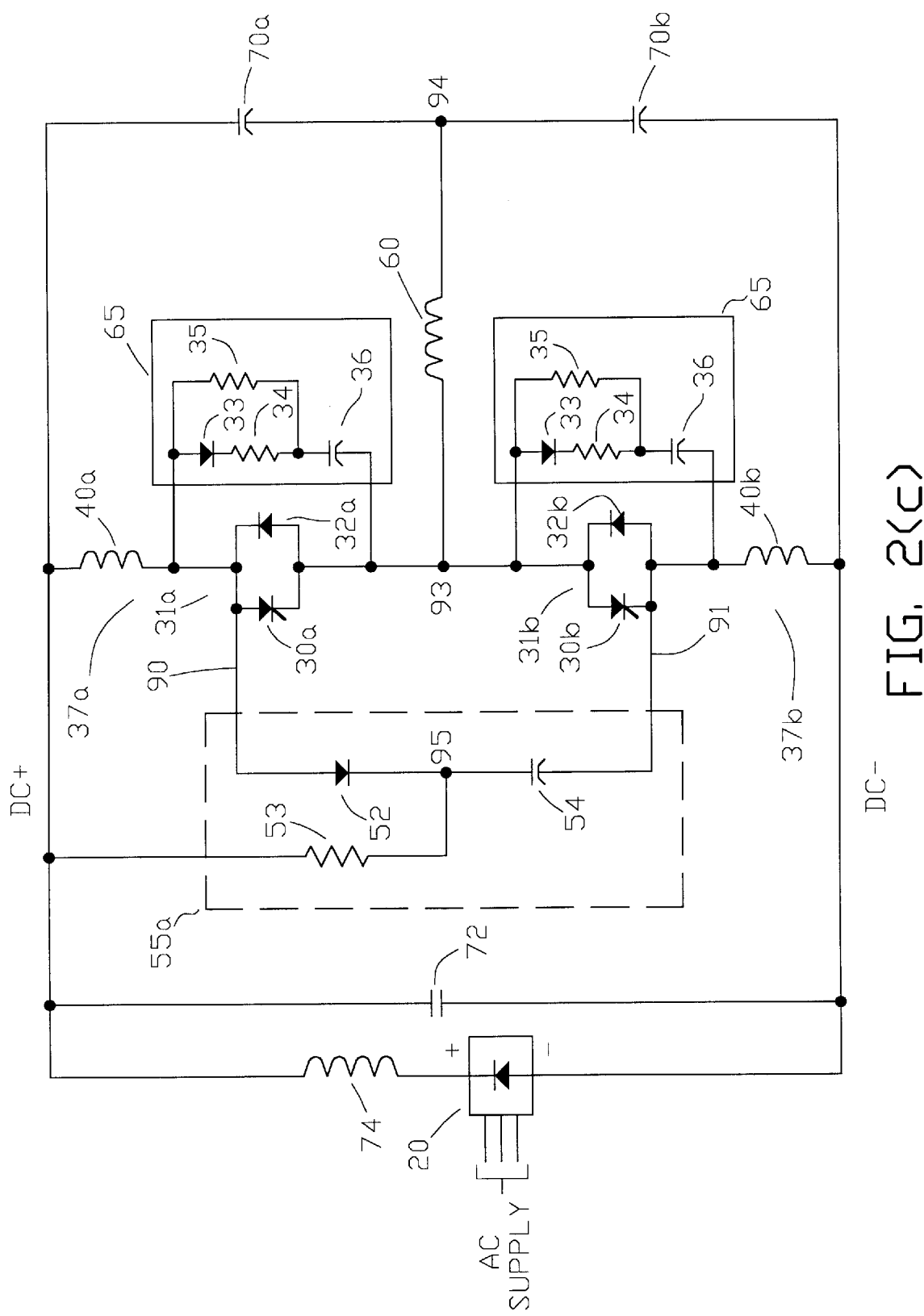
FIG. 2(c) is a simplified schematic diagram of another example of the fault tolerant power supply circuit of the present invention wherein a half-bridge inverter is used.
Figure 2D:
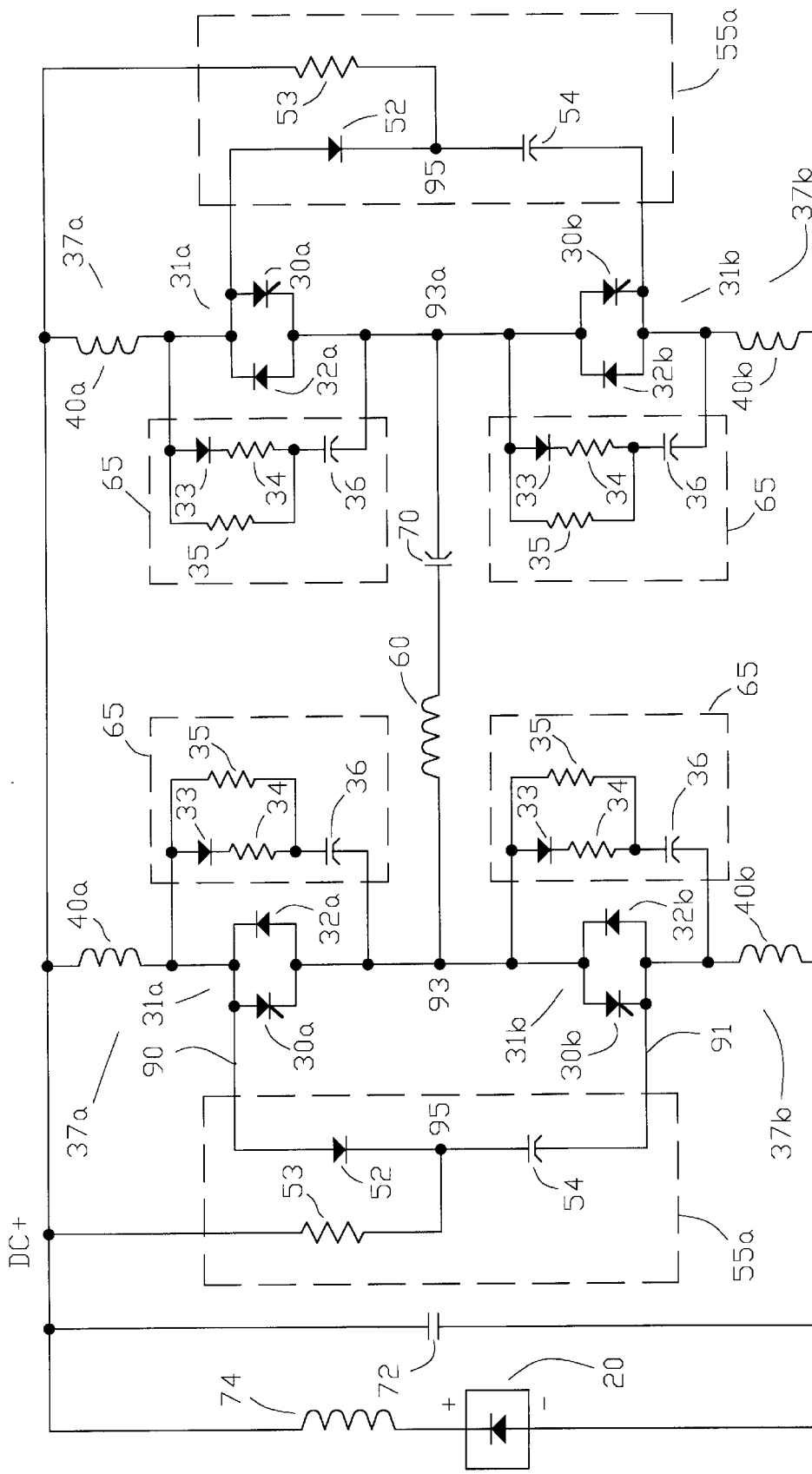
FIG. 2(d) is a simplified schematic diagram of another example of the fault tolerant power supply circuit of the present invention wherein a full-bridge inverter is used.

Referring to the drawings, wherein like numerals indicate like elements, there is shown in FIG. 2(a) one example of the fault tolerant power supply circuit 10 of the present invention. Each of two switching devices 30a and 30b (such as, but not limited to SCRs) is connected anti-parallel with antiparallel diodes 32a and 32b, respectively, to form switch circuits 31a and 32b respectively. The first terminals of the switch circuits are connected together at switch common connection 93. The first terminals of di/dt reactors 40a and 40b are connected to the second terminals of switch circuits 31a and 31b, respectively, to form switch modules 37a and 37b, respectively. The second terminals of di/dt reactors 40a and 40b are connected to the positive and negative dc buses (output lines) of dc power source 20, respectively. The power source comprises rectifier bridge 20 (shown diagrammatically) with optional series filter inductor 74 and parallel filter capacitor 72.

Protective circuit 55 comprises a series-connected blocking diode 52 and protective capacitor 54 with common connection 95, and discharge resistor 53 connected in parallel with capacitor 54, as shown in FIG. 2(a). The capacitance of protective capacitor 54 is selected as further described below so that it will charge to a peak voltage value that is less than the peak allowable voltage for the switching device. The peak allowable voltage for the switching device may be the rated repetitive forward blocking voltage of the device, which is the maximum instantaneous value of forward voltage that occurs across the device. Lines 90 and 91 of protective circuit 55 are connected between the first terminals of di/dt reactors 40a and 40b (second terminals of switch circuits 31a and 31b), respectively.

First terminal of load induction coil 60 is connected to switch common connection 93. The second terminal of load induction coil 60 is connected to a capacitor common connection 94 between two series-connected commutation or tank capacitors 70a and 70b, that, in series combination, are connected across the positive and negative dc buses, respectively, of the power source. The commutation capacitors divert load current from a switching device until the current drops below the holding current and causes the switching device to turn off. Relative to the load induction coil, the pair of switching modules are connected in inverse parallel configuration.

When di/dt reactors are used, typically a snubber circuit is used across each switch circuit to control voltage transients across the switching device and antiparallel diode during commutation and voltage time rate-of-change (dv/dt) across the switching device. A typical, but non-limiting, example of an optional snubber circuit 65 is illustrated in FIG. 2(a). The snubber circuit comprises capacitor 36, resistor 34 and diode 33 connected together in series, and a resistor 35, connected in parallel across the series combination of diode 33 and resistor 34. Capacitor 36 and resistor 34 form a series resonant circuit with the di/dt reactor in its associated switch module. Resistor 35 generally has a resistance value much greater than that of resistor 34 to decrease the discharge current of capacitor 36 through the switching device in the associated switch circuit.

In an induction metal melting application, load induction coil 60 is typically wound around the exterior of the crucible in which the metal load is placed. By alternate cycling of switching devices 30*a* and 30*b*, dc output current from power source 20 establishes an ac current through load induction coil 60. The ac current flowing through the coil generates a magnetic field that inductively couples with the metal load in the crucible. The magnetic field generates an eddy current in the metal load which heats and melts the metal.

When the power supply circuit 10 is in operation, protective capacitor 54 charges up to a peak voltage that is somewhat higher than the dc bus voltage and less than the peak allowable voltage of switching devices 30*a* and 30*b*. Dc charge current is provided through diode 52 from power source 20, and during the transitions of the antiparallel diodes from forward to reverse bias. Impedance values for resistor 53 and capacitor 54 are selected so that the R-C time constant for the circuit is sufficiently large in comparison with the time period of the operating frequency as established by the switching frequency of devices 30*a* and 30*b*. Generally, to meet this condition and minimize power losses, resistor 53 should be sufficiently large to provide a complete discharge time of at least 60 seconds for capacitor 54. This time should not exceed the time for discharging filter capacitor 72, if used. Additionally, the inverse of the product of the resistance and capacitance of resistor 53 and capacitor 54, respectively, will be much greater than the operating switching frequency of the switch circuits.

Figure 3:
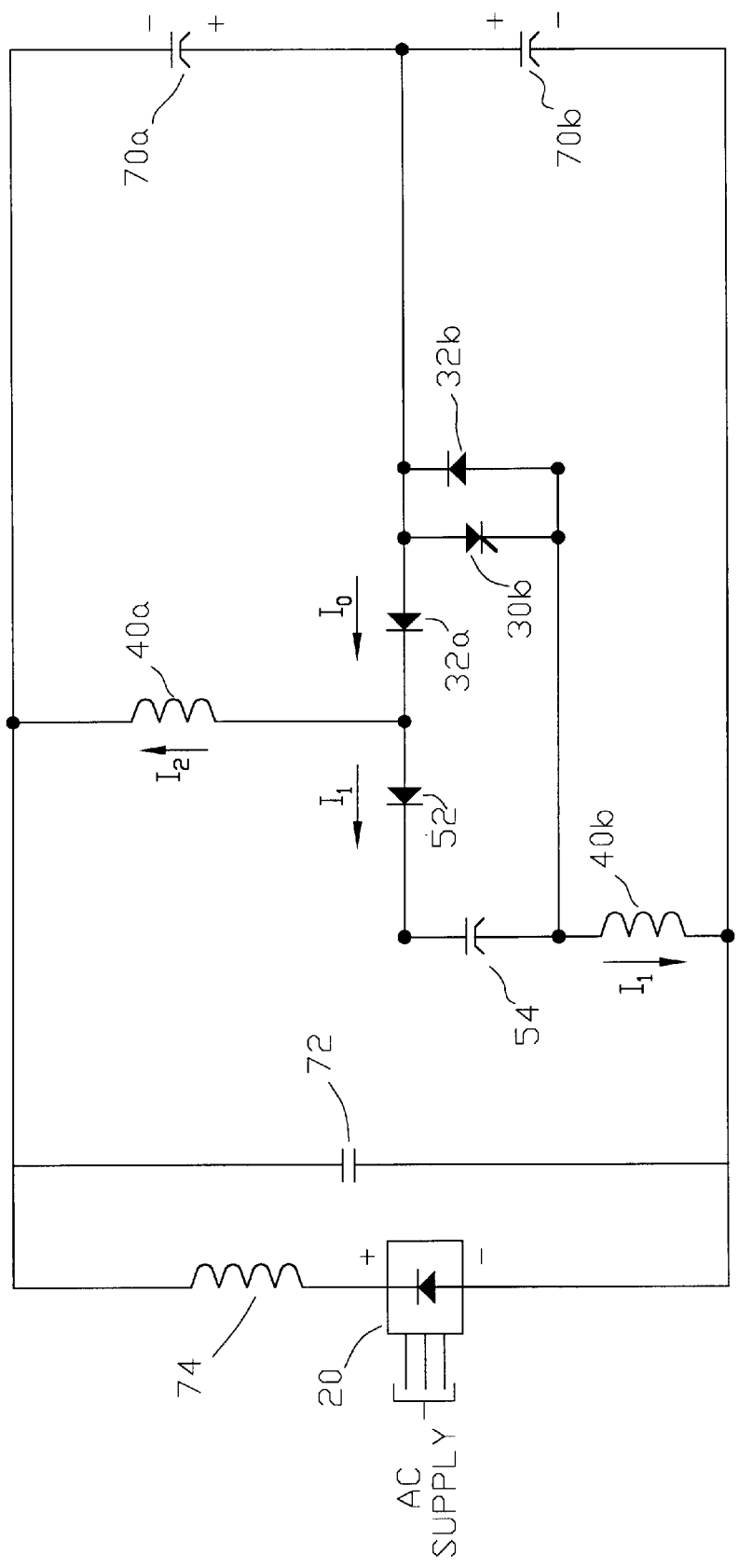
FIG. 3 is a simplified equivalent schematic diagram of one example of the fault tolerant power supply circuit of the present invention immediately following the occurrence of a short circuit across an induction coil in the circuit when SCR 30b in FIG. 2(a) is non-conducting.

As an example of the operation of protective circuit 55, a worst-case condition of an unintentional shorting of load induction coil 60 occurs shortly after the current flow through switching device 30*a* has crossed zero reference and antiparallel diode 32*a* has started to conduct. At this time, the voltages across load induction coil 60 and commutation capacitor 70*b* are at their maximum values. The equivalent circuit for these conditions is shown in FIG. 3, with coil 60 shorted (not shown) and switching device 30*b* non-conducting.

The maximum voltage across commutation capacitor 70*b* is applied across diodes 32*a* and 52, protective capacitor 54 and di/dt reactor 40*b*. Since the voltage across a capacitor cannot change instantaneously, the voltage difference between capacitor 70*b* and protective capacitor 54 must be instantaneously applied across di/dt reactor 40*b*. Non-conducting switching device 30*b*, connected in parallel with protective capacitor 54 (via diodes 32*a* and 52 with negligible voltage drop when forward biased and conducting current) will be subject to the same voltage as that across protective capacitor 54. The capacitance of protective capacitor 54 is selected so that the short circuit current can not charge capacitor 54 to a voltage that exceeds the peak allowable voltage for switching devices 30*a* and 30*b*. Consequently, the capacitance of protective capacitor 54 will be sufficient to absorb a charge from commutation capacitors 70*a* and 70*b* to a voltage that is less than the peak allowable voltage rating of switching devices 30*a* and 30*b*.

FIG. 2(*b*) illustrates a similar protection scheme as that in FIG. 2(*a*) for an inverter with a full-bridge rectifier rather than a half-bridge rectifier. A single commutation capacitor 70 can be used in series with load induction coil 60 across the ac output of the full-bridge. A protective circuit 55 is provided for each of the two pairs of switch modules that comprise the two legs of the full-bridge inverter.

FIG. 2(*c*) illustrates another example of the fault tolerant power supply circuit of the present invention wherein the first terminal of discharge resistor 53 in protective circuit 55*a* is connected to common connection 95, and the second terminal of discharge resistor 53 is connected to the positive dc bus of power source 20 so that protective capacitor 54 discharges through the positive dc bus. FIG. 2(*d*) illustrates a similar protection scheme as that in FIG. 2(*c*) for an inverter with a full-bridge rectifier rather than a half-bridge rectifier. A single commutation capacitor 70 can be used in series with load induction coil 60 across the ac output of the full-bridge. A protective circuit 55*a* is provided for each of the two pairs of switch modules that comprise the two legs of the full-bridge inverter.

Figure 7:
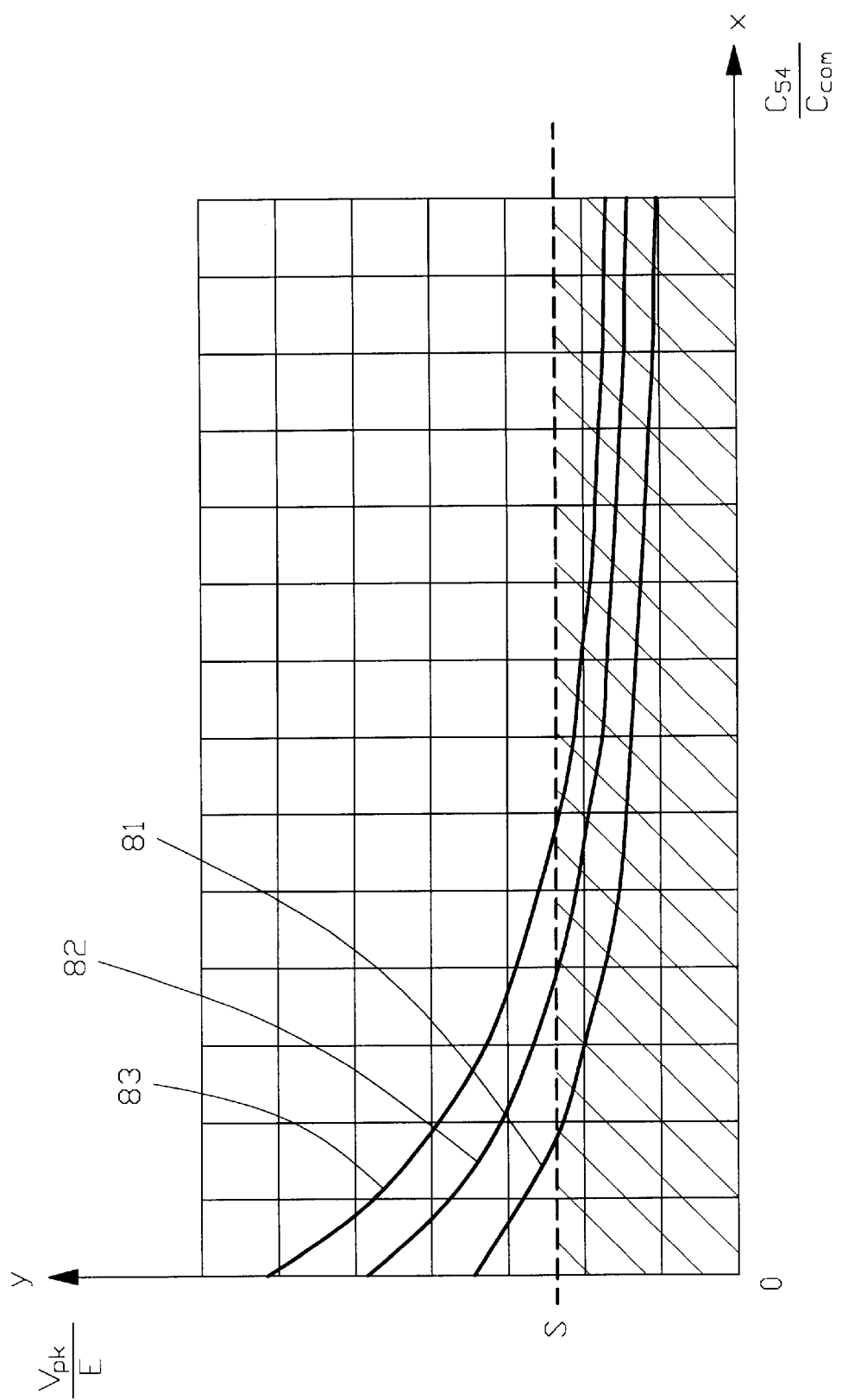
FIG. 7 is a graphical illustration of the method of selecting the capacitance of a protective capacitor used in the fault tolerant power supply circuit of the present invention.

FIG. 7 illustrates one method for determining suitable values of capacitance ($C_{54}$) for protective capacitor 54. The y-axis in FIG. 7 represents the peak allowable voltage ($V_{pk}$) across switching devices 30*a* and 30*b* defined as the ratio of the peak allowable voltage to the dc voltage (E) of the dc power source. The x-axis in FIG. 7 represents the appropriate selection of capacitance $C_{54}$ as the ratio of capacitance $C_{54}$ to the equivalent commutation or tank capacitance ($C_{com}$), which is equal to the sum of the capacitances for commutation capacitors 70*a* and 70*b*, or the capacitance of the single commutation capacitor 70 for a full-bridge inverter. Curves 81, 82 and 83 in FIG. 7 are representative of a family of curves wherein each curve is defined by a unique value of the ratio (R) of the voltage ($V_{tcap}$) across either capacitor 70(*a*) or capacitor 70(*b*) (substantially equal voltages), or capacitor 70 for a full-bridge circuit, to the voltage E of the dc power source ($R=V_{tcap}/E$). Further ratio R is increasing in value for curves in the direction from curve 81 to curve 83. Illustrating the method of using FIG. 7 to select a suitable value for capacitance $C_{54}$, assume "S" represents the allowed y-axis ratio for peak allowable voltage ($V_{pk}$), for example 1,800 volts. Then the x-axis ratio for $C_{54}$ must be selected from the portion of the appropriate curve (determined by the fixed operating voltage $V_{tcap}$ for a particular application) in the shaded area below the dash line "S". Dc power source voltage E is substantially constant for a particular operating system.

Major factors impacting the desired capacitance of protective capacitor 54 are: the maximum peak allowable voltage of switching devices 30*a* and 30*b*; peak voltage observed across the commutation capacitors; voltage across protective capacitor 54 immediately prior to a short circuit in load induction coil 60; and the capacitance of the commutation capacitors. For example, if: the voltage across protective capacitor 54 immediately prior to a short circuit in coil 60 is 1,000 volts; the maximum peak allowable voltage for switching devices 30*a* and 30*b* is 1,800 volts; and the peak voltage observed across the commutation capacitors is 4,200 volts, the desired capacitance of protective capacitor 54 is at least five times the equivalent commutation capacitance.

Figure 4A:
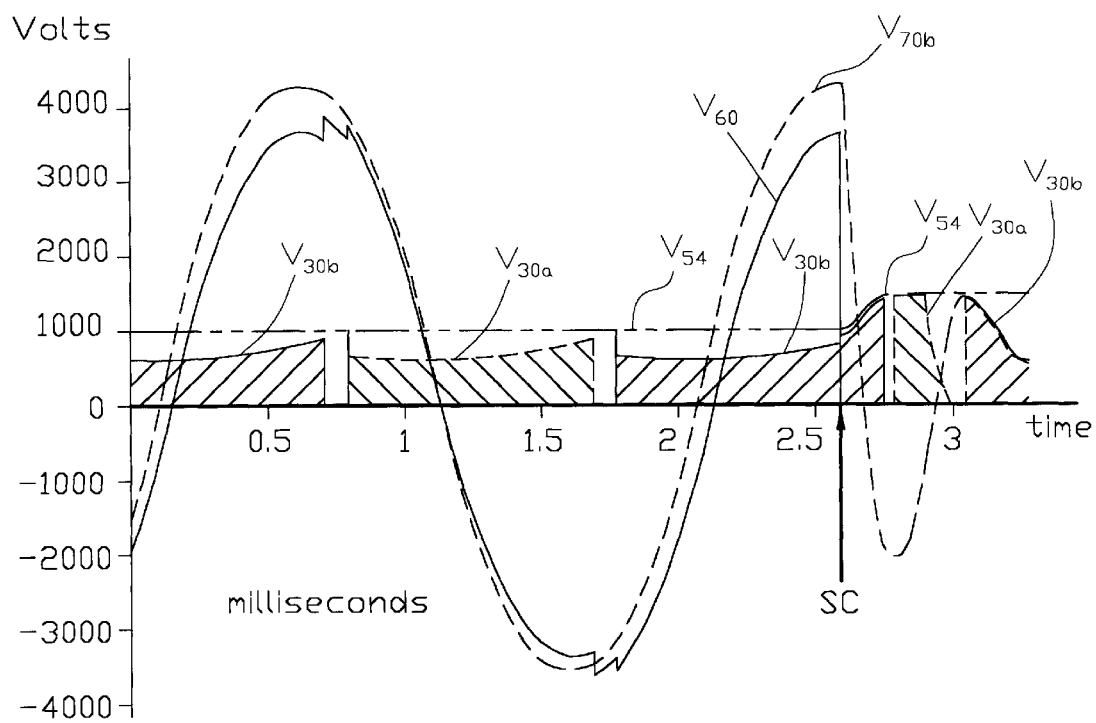
FIG. 4(a) is a waveform diagram illustrating the short circuit protection characteristics achieved with the example of the fault tolerant power supply circuit of the present invention shown in FIG. 2(a) or FIG. 2(c).
Figure 4B:
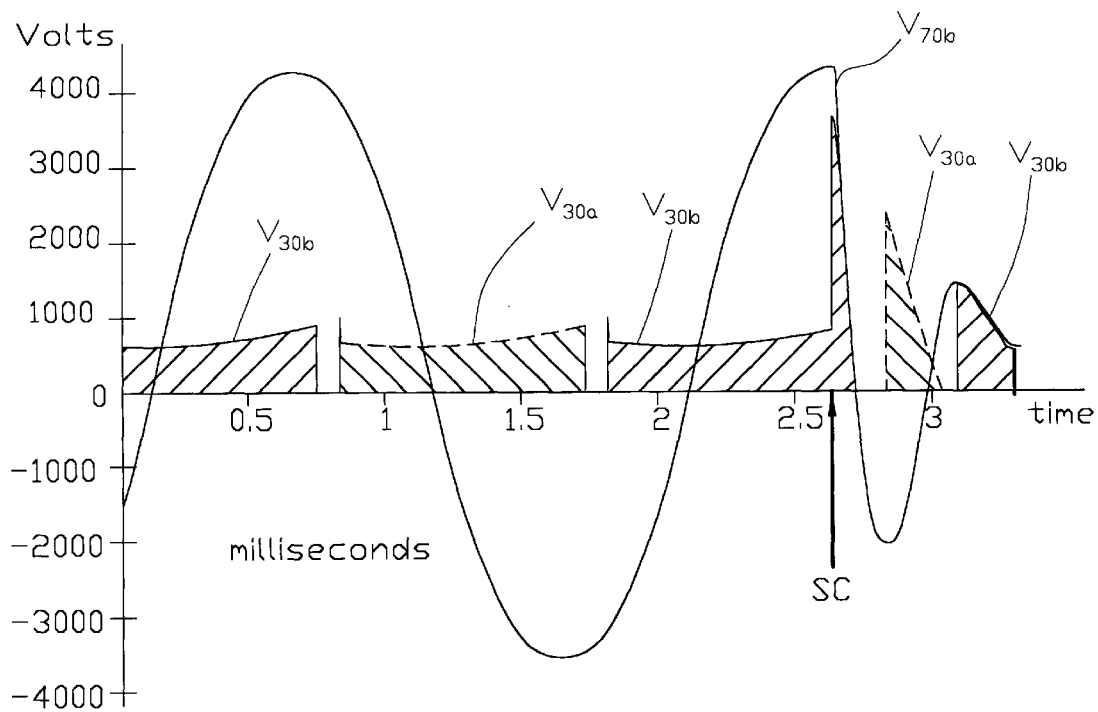
FIG. 4(b) is a waveform diagram illustrating the short-circuit characteristics of a power supply circuit without the protection provided by the fault tolerant power supply circuit of the present invention shown in FIG. 2(a) or FIG. 2(c).

FIG. 4(*a*) and FIG. 4(*b*) graphically illustrate the advantage of the protective circuit 55 of the present invention as shown in FIG. 2(*a*) through FIG. 2(*d*). Curve $V_{70b}$ represents the voltage over time (in milliseconds (ms) for this particular example) across commutation capacitor 70*b*. Curve $V_{60}$ represents the voltage over time across load induction coil 60. Curve $V_{30b}$ represents the voltage over time across switching device 30*b*. Curve $V_{30a}$ represents the voltage over time across switching device 30*a*. Curve $V_{54}$ represents the voltage over time across protective capacitor 54. An unintentional short-circuit occurs at the time marked as "SC" in FIG. 4(*a*) and FIG. 4(*b*). In FIG. 4(*b*) (no protective capacitor 54), at time SC, the voltage across switching device 30*b* rises to almost 4,000 volts. In FIG. 4(*a*) (with protective capacitor 54), at time SC, the voltage across switching device 30*b* is held to approximately 1,450 volts, which is the voltage on protective capacitor 54, and is far less than the 1,800 volts maximum allowable peak voltage for switching devices 30a and 30b. Prior to the time of the short circuit, protective capacitor 54 is charged to approximately 1,000 volts. The voltage on protective capacitor 54 rises an additional 450 volts due to charge from commutation capacitor 70b.

Figure 5A:
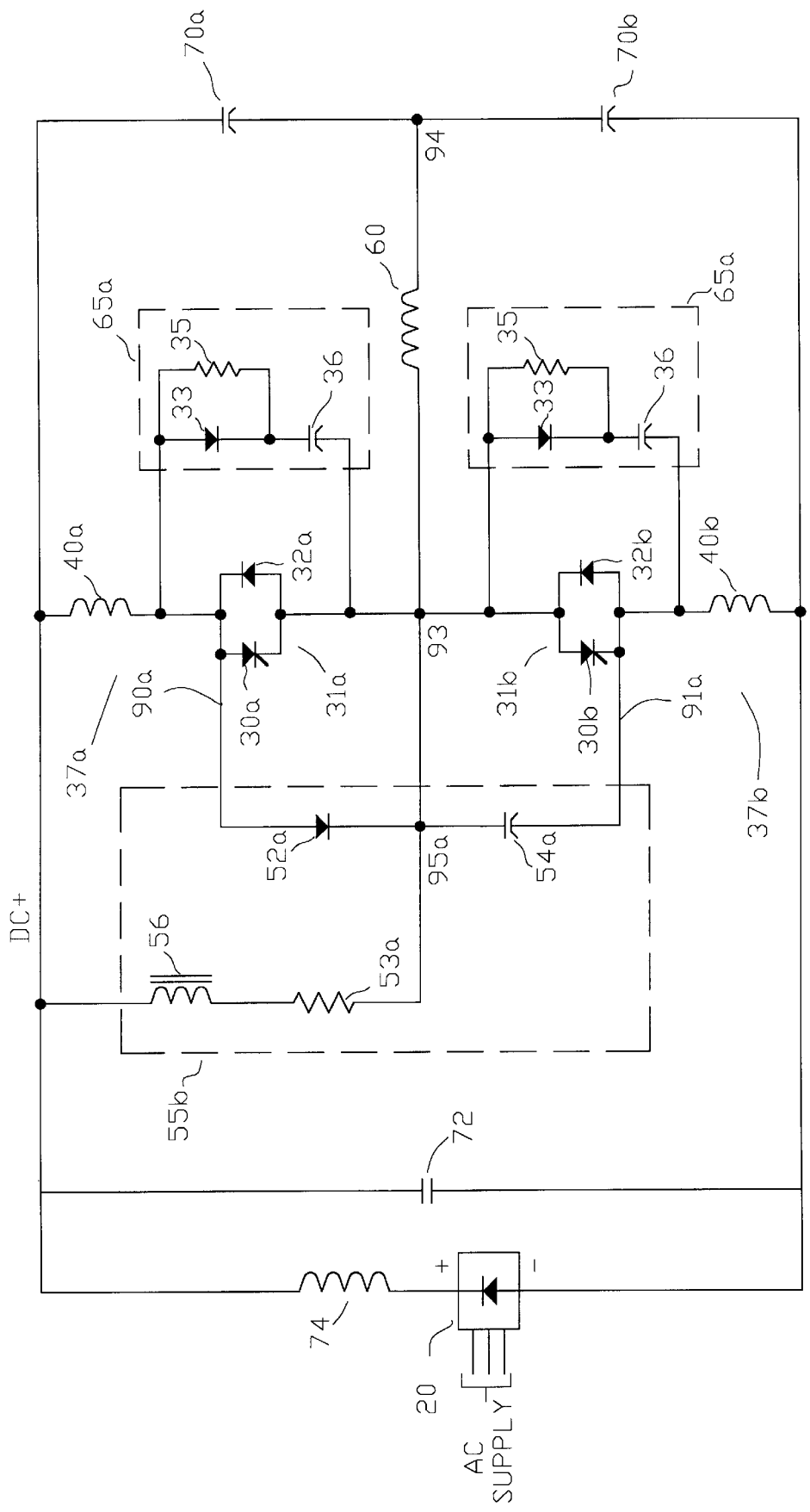
FIG. 5(a) is a simplified schematic diagram of another example of the fault tolerant power supply circuit of the present invention wherein a half-bridge inverter is used.

FIG. 5(a) illustrates another example of a fault tolerant power supply circuit of the present invention. In this example, snubber circuits 65a do not use charging resistor 34 as in the examples shown in FIG. 2(a) through FIG. 2(d). Protective circuit 55b in FIG. 5(a) includes a series-connected diode 52a and protective capacitor 54a with common connection 95a. The first terminal of discharge resistor 53a is connected to common connection 95a, and the second terminal of resistor 53a is connected to the first terminal of choke 56, which has its second terminal connected to the positive dc bus of the dc power source. Lines 90a and 91a of protective circuit 55b are connected between the first terminals of di/dt reactors 40a and 40b (second terminals of switch circuits 31a and 31b), respectively.

Snubber charging resistor 34 shown in FIG. 2(a) through FIG. 2(d) is used to dampen the oscillation in the series-resonant circuit formed by the associated di/dt reactor and snubber capacitor 36. This reduces the voltage spike on the associated switching device at the time when the antiparallel diode in the other switch circuit transitions to reverse bias. However use of charging resistor 34 has negative effects since it increases the non-conducting dv/dt of its associated switching device and generates power losses that increase as the switching frequency increases.

The fault tolerant protection power supply circuit shown in FIG. 5(a) can be used without a snubber charging resistor since protective circuit 55b is connected across switching devices 30a and 30b. Protective capacitor 54a, if selected as disclosed above, will have sufficient capacitance to clamp voltage overshoots across a switching device at the time when the antiparallel diode in the other switch circuit transitions to reverse bias. FIG. 6 graphically illustrates the advantage of protective circuit 55b as shown in FIG. 5(a). Curve $V_{54a}$ represents the voltage over time (in microseconds ($\mu s$) for this particular example) across charged protective capacitor 54a, which in this example is 1,000 volts. Curve $V'_{30}$ represents the voltage over time across switching device 30a or 30b for the circuits shown in FIG. 2(a) through FIG. 2(d). Curve $V_{30}$ represents the voltage over time across switching device 30a or 30b for the circuit shown in FIG. 5(a). Curve 154a represents the current over time through protective capacitor 54a in FIG. 5(a). As illustrated by curve $V_{30}$, the voltage across switching device 30a or 30b in FIG. 5 will be clamped to the voltage of protective capacitor 54a. Comparing this with curve $V'_{30}$, which represents the voltage across a switching device in a circuit utilizing a snubber charging resistor as shown in FIG. 2(a) through FIG. 2(d), the dv/dt is greater for the circuit with the snubber charging resistor than without it since the difference in voltage curves $V_{30}$ and $V'_{30}$ is equal to the voltage drop on charging resistor 34.

Since the pair of antiparallel diodes used in the circuit of FIG. 5(a) switch from forward bias (conduction) to reverse bias (non-conduction) at the switching frequency for the pair of switching devices in the circuit, clamping $V_{30}$ will result in further charging of protective capacitor 54a. This additional charge or voltage on protective capacitor 54a will be discharged via resistor 53a and choke 56. The resistance of resistor 53a and inductance of choke 56a are selected to optimize the return of energy back to the dc power source from snubber circuit 65a and maintain the appropriate clamp voltage. Further the use of resistor 53a in series with choke 56 will reduce the Root Mean Square (RMS) value and jitter of the discharge current, $I_{54a}$, through protective capacitor 54a. Consequently, power loss in discharge resistor 53a is reduced. If choke 56 is fabricated to have a suitable value of resistance, resistor 53 and choke 56 may be replaced by a single resistive/inductive element.

If snubber circuit 65a shown in FIG. 5(a) has components selected to maintain the same dv/dt value for snubber circuit 65 in FIG. 2(a) through FIG. 2(d), the capacitance of snubber capacitor 36 in FIG. 5(a) will be less than the capacitance of snubber capacitor 36 in FIG. 2(a) through FIG. 2(d). Consequently, the power loss in snubber resistor 35 in FIG. 5(a) will be less than that for snubber resistor 35 in FIG. 2(a) through FIG. 2(d).

Figure 5B:
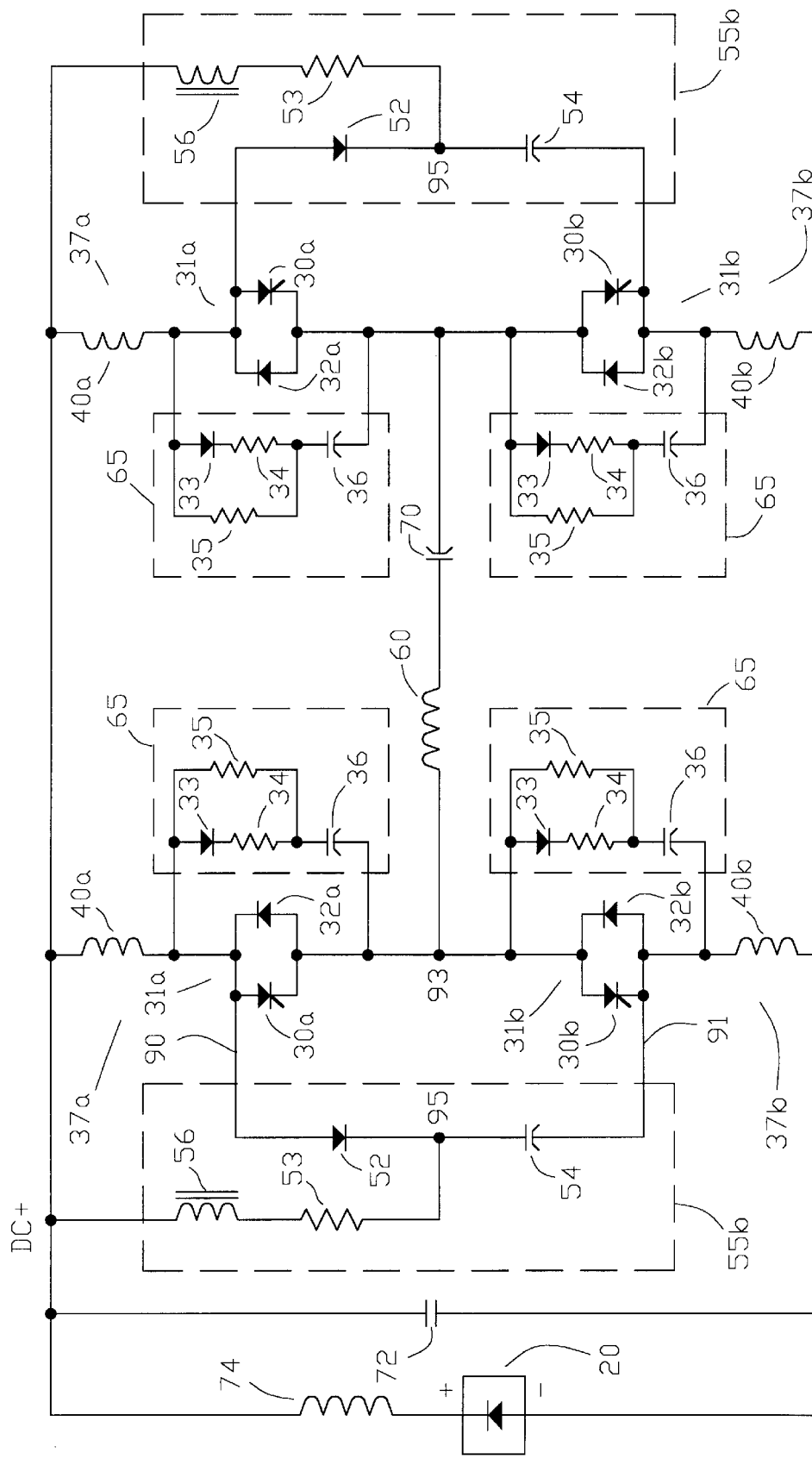
FIG. 5(b) is a simplified schematic diagram of another example of the fault tolerant power supply circuit of the present invention wherein a full-bridge inverter is used.
Figure 6:
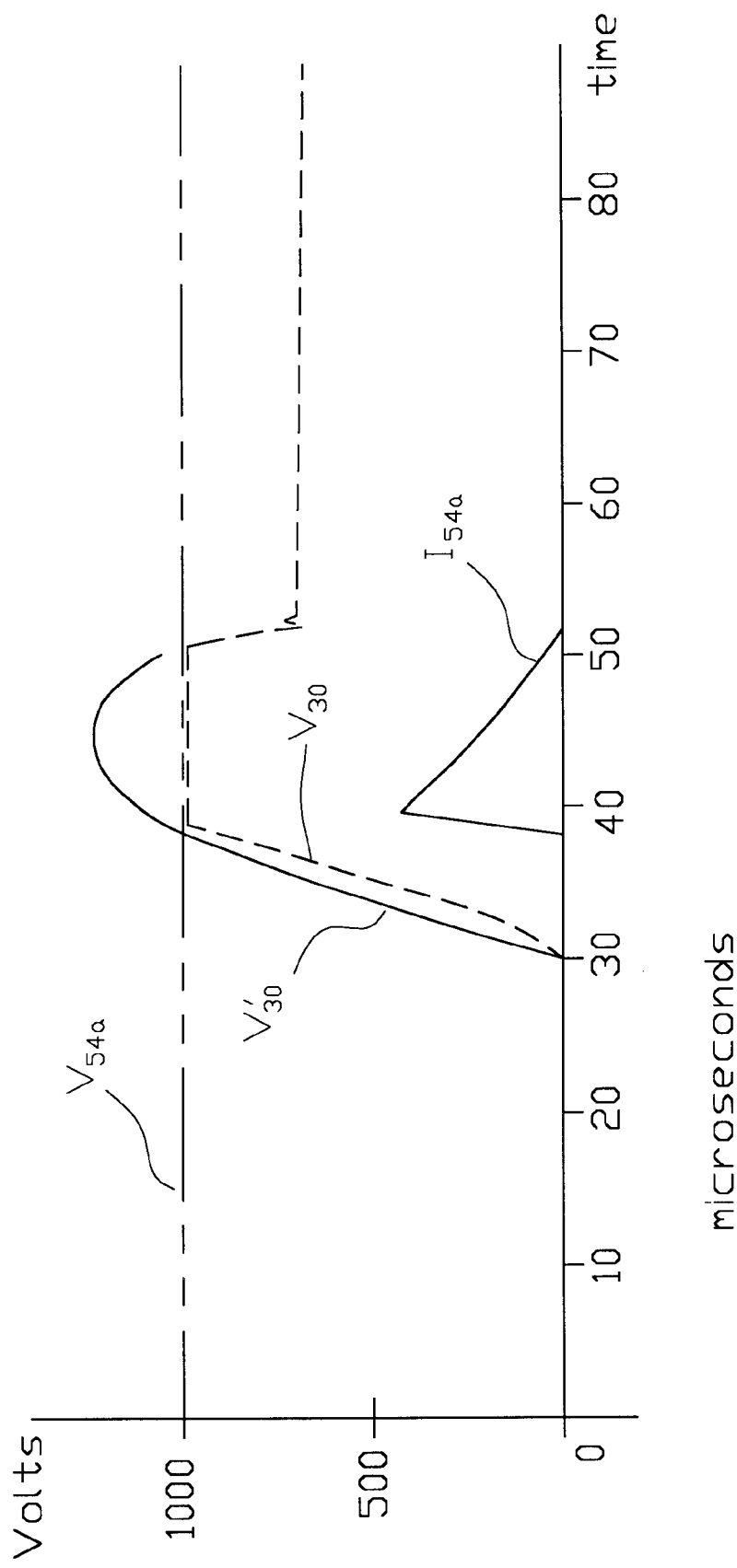
FIG. 6 is a waveform diagram illustrating the voltage clamping characteristics achieved with the example of the fault tolerant power supply circuit of the present invention shown in FIG. 5(a).

FIG. 5(b) illustrates a similar protection scheme as that in FIG. 5(a) for an inverter with a full-bridge rectifier rather than a half-bridge rectifier. A single commutation capacitor 70 can be used in series with load induction coil 60 across the ac output of the full-bridge. A protective circuit 55 is provided for each of the two pairs of switch modules that comprise the two legs of the full-bridge rectifier.

The examples of the invention include reference to specific electrical components. One skilled in the art may practice the invention by substituting components that are not necessarily of the same type but will create the desired conditions or accomplish the desired results of the invention. For example, single components may be substituted for multiple components or vice versa. Further one skilled in the art may practice the invention by rearranging components to create the desired conditions or accomplish the desired results of the invention. While a single pair of switch circuits are illustrated in the examples of the invention, multiple pairs of switch circuits connected in parallel may be utilized to practice the present invention. The short circuit on the load induction coil may be a partial short circuit of the coil in all of the examples of the invention. Further while the examples illustrate operation of the invention in series-resonant power supplies, the invention is applicable to other power supply topologies with appropriate modifications as understood by one who is skilled in the art.

The foregoing examples do not limit the scope of the disclosed invention. The scope of the disclosed invention is further set forth in the appended claims.

What is claimed is:

1. A fault tolerant power supply, the supply comprising a dc power source having a dc output with a positive and a negative dc bus; an inverter leg, the inverter leg comprising a pair of switch modules; each one of the pair of switch modules comprising a di/dt reactor in series connection with a switch circuit; each of the switch circuits comprising a switching device connected anti-parallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules having the di/dt reactor connected to the positive dc bus, the second of the pair of switch modules having the di/dt reactor connected to the negative dc bus, the pair of switch modules having a switch common connection, the common switch connection connecting together the cathode of the switching device in the first of the pair of the switch modules and the anode of the switching device in the second of the pair of the switch modules; a first and a second commutation capacitor connected in series across the dc output of the dc power source, the first and second commutation capacitors connected together at a capacitor common connection; a load induction coil connected between the switch common connection and the capacitor common connection; the improvement comprising:

a protective circuit comprising:
        a protective capacitor;
        a blocking diode having its cathode connected in series with the protective capacitor, the series combination of the blocking diode and protective capacitor connected across the anode of the switching device in the first of the pair of switch circuits and the cathode of the switching device in the second of the pair of switch circuits; and
        a discharge resistor connected in parallel with the protective capacitor, whereby the protective capacitor charges to a voltage less than the peak allowable voltage of the switching devices, and absorbs additional charge from the first and second commutation capacitors when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

2. The fault tolerant power supply of claim 1 further comprising a snubber circuit for each one of the switch circuits, the snubber circuit comprising:

a snubber capacitor;
    a first snubber resistor;
    a snubber diode, and
    a second snubber resistor connected in parallel with the series combination of the snubber diode and the first snubber resistor, the series combination of the snubber capacitor, the first snubber resistor and the snubber diode connected across the switch circuit, the anode of the snubber diode connected to the anode of the switching device.

3. A fault tolerant power supply, the supply comprising a dc power source having a dc output with a positive and a negative dc bus; a pair of inverter legs, each one of the pair of inverter legs comprising a pair of switch modules; each one of the pair of switch modules comprising a di/dt reactor in series connection with a switch circuit; each of the switch circuits comprising a switching device connected anti-parallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules for each of the pair of inverter legs having the di/dt reactor connected to the positive dc bus, the second of the pair of switch modules for each of the pair of inverter legs having the di/dt reactor connected to the negative dc bus, the pair of switch modules in each one of the pair of inverter legs having a switch common connection, the common switch connection connecting together the cathode of the switching device in the first of the pair of the switch modules and the anode of the switching device in the second of the pair of the switch modules in each one of the pair of inverter legs; a load induction coil; a commutation capacitor connected in series with the load induction coil; the series combination of the load induction coil and the commutation capacitor connected between the switch common connection in the first of the pair of inverter legs and the switch common connection in the second of the pair of inverter legs; the improvement comprising:

a protective circuit for each one of the pair of inverter legs, the protective circuit comprising:
        a protective capacitor;
        a blocking diode having its cathode connected in series with the protective capacitor, the series combination of the blocking diode and protective capacitor connected across the anode of the switching device in the first of the pair of switch circuits in the pair of switch modules and the cathode of the switching device in the second of the pair of switch circuits in the pair of switch modules; and
        a discharge resistor connected in parallel with the protective capacitor, whereby the protective capacitor charges to a voltage less than the peak allowable voltage of the switching devices, and absorbs additional charge from the commutation capacitor when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

4. The fault tolerant power supply of claim 3 further comprising a snubber circuit for each one of the switch circuits, the snubber circuit comprising:

a snubber capacitor;
    a first snubber resistor;
    a snubber diode, and
    a second snubber resistor connected in parallel with the series combination of the snubber diode and the first snubber resistor, the series combination of the snubber capacitor, the first snubber resistor and the snubber diode connected across the switch circuit, the anode of the snubber diode connected to the anode of the switching device.

5. A fault tolerant power supply, the supply comprising a dc power source having a dc output with a positive and a negative dc bus; an inverter leg, the inverter leg comprising a pair of switch modules; each one of the pair of switch modules comprising a di/dt reactor in series connection with a switch circuit; each of the switch circuits comprising a switching device connected anti-parallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules having the di/dt reactor connected to the positive dc bus, the second of the pair of switch modules having the di/dt reactor connected to the negative dc bus, the pair of switch modules having a switch common connection, the common switch connection connecting together the cathode of the switching device in the first of the pair of the switch modules and the anode of the switching device in the second of the pair of the switch modules; a first and a second commutation capacitor connected in series across the dc output of the dc power source, the first and second commutation capacitors connected together at a capacitor common connection; a load induction coil connected between the switch common connection and the capacitor common connection; the improvement comprising:

a protective capacitor;

a blocking diode having its cathode connected in series with the protective capacitor, the protective capacitor and the blocking diode commonly connected together at a first common terminal, the series combination of the blocking diode and the protective capacitor connected across the anode of the switching device in the first of the pair of switch circuits and the cathode in the switching device of the second of the pair of switch circuits; and a discharge resistor connected between the first common terminal and the positive dc bus, whereby the protective capacitor charges to a voltage less than the peak allowable voltage of the switching devices, and absorbs additional charge from the first and second commutation capacitors when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

6. The fault tolerant power supply of claim 5 further comprising a snubber circuit for each one of the switch circuits, the snubber circuit comprising:

a snubber capacitor;

a first snubber resistor;

a snubber diode, and a second snubber resistor connected in parallel with the series combination of the snubber diode and the first snubber resistor, the series combination of the snubber capacitor, the first snubber resistor and the snubber diode connected across the switch circuit, the anode of the snubber diode connected to the anode of the switching device.

7. A fault tolerant power supply, the supply comprising a dc power source having a dc output with a positive and a negative dc bus; a pair of inverter legs, each one of the pair of inverter legs comprising a pair of switch modules; each one of the pair of switch modules comprising a di/dt reactor in series connection with a switch circuit; each of the switch circuits comprising a switching device connected anti-parallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules for each of the pair of inverter legs having the di/dt reactor connected to the positive dc bus, the second of the pair of switch modules for each of the pair of inverter legs having the di/dt reactor connected to the negative dc bus, the pair of switch modules in each one of the pair of inverter legs having a switch common connection, the common switch connection connecting together the cathode of the switching device in the first of the pair of the switch modules and the anode of the switching device in the second of the pair of the switch modules in each one of the pair of inverter legs; a load induction coil; a commutation capacitor connected in series with the load induction coil; the series combination of the load induction coil and the commutation capacitor connected between the switch common connection in the first of the pair of inverter legs and the switch common connection in the second of the pair of inverter legs; the improvement comprising:

a protective circuit for each one of the pair of inverter legs, the protective circuit comprising:

a protective capacitor;

a blocking diode having its cathode connected in series with the protective capacitor, the protective capacitor and the blocking diode commonly connected together at a first common terminal, the series combination of the blocking diode and protective capacitor connected across the anode of the switching device of the first of the pair of switch circuits and the cathode of the switching device of the second of the pair of switch circuits; and a discharge resistor connected between the first common terminal and the positive dc bus, whereby the protective capacitor charges to a voltage less than the peak allowable voltage of the switching devices, and absorbs additional charge from the commutation capacitor when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

8. The fault tolerant power supply of claim 7 further comprising a snubber circuit for each one of the switch circuits, the snubber circuit comprising:

a snubber capacitor;

a first snubber resistor;

a snubber diode, and a second snubber resistor connected in parallel with the series combination of the snubber diode and first snubber resistor, the series combination of the snubber capacitor, the first snubber resistor and the snubber diode connected across the switch circuit, the anode of the snubber diode connected to the anode of the switching device.

9. A fault tolerant power supply, the supply comprising a dc power source having a dc output with a positive and a negative dc bus; an inverter leg, the inverter leg comprising a pair of switch modules; each one of the pair of switch modules comprising a di/dt reactor in series connection with a switch circuit; each of the switch circuits comprising a switching device connected anti-parallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules having the di/dt reactor connected to the positive dc bus, the second of the pair of switch modules having the di/dt reactor connected to the negative dc bus, the pair of switch modules having a switch common connection, the common switch connection connecting together the cathode of the switching device in the first of the pair of the switch modules and the anode of the switching device in the second of the pair of the switch modules; a first and a second commutation capacitor connected in series across the dc output of the dc power source, the first and second commutation capacitors connected together at a capacitor common connection; a load induction coil connected between the switch common connection and the capacitor common connection; the improvement comprising:
   a protective circuit comprising:
      a protective capacitor;
      a blocking diode having its cathode connected in series with the protective capacitor, the protective capacitor and the blocking diode commonly connected together at a first common terminal, the series combination of the blocking diode and the protective capacitor connected across the anode of the switching device in the first of the pair of switch circuits and the cathode in the switching device of the second of the pair of switch circuits;
      a discharge resistor having a first resistor terminal connected to the first common terminal; and
      a choke having a first choke terminal connected to a second resistor terminal of the discharge resistor and a second choke terminal connected to the positive dc bus; and
   a snubber circuit for each one of the switch circuits, the snubber circuit comprising:
      a snubber capacitor;
      a snubber diode; and
      a snubber resistor connected in parallel with the snubber diode, the series combination of the snubber capacitor and the snubber diode connected across the switch circuit, the anode of the snubber diode connected to the anode of the switching device, whereby the protective capacitor charges to a voltage less than the peak allowable voltage of the switching devices, clamps voltage overshoots across the switching devices when the antiparallel diodes transition to reverse bias, and absorbs additional charge from the first and second commutation capacitors when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

10. A fault tolerant power supply, the supply comprising a dc power source having a dc output with a positive and a negative dc bus; a pair of inverter legs, each one of the pair of inverter legs comprising a pair of switch modules; each one of the pair of switch modules comprising a di/dt reactor in series connection with a switch circuit; each of the switch circuits comprising a switching device connected antiparallel with an antiparallel diode, the first of the pair of switch modules having the anode of the switching device commonly connected to the di/dt reactor in the first of the pair of switch modules, the second of the pair of switch modules having the cathode of the switching device commonly connected to the di/dt reactor in the second of the pair of switch modules, the first of the pair of switch modules for each of the pair of inverter legs having the di/dt reactor connected to the positive dc bus, the second of the pair of switch modules for each of the pair of inverter legs having the di/dt reactor connected to the negative dc bus, the pair of switch modules in each one of the pair of inverter legs having a switch common connection, the common switch connection connecting together the cathode of the switching device in the first of the pair of the switch modules and the anode of the switching device in the second of the pair of the switch modules in each one of the pair of inverter legs; a load induction coil; a commutation capacitor connected in series with the load induction coil; the series combination of the load induction coil and the commutation capacitor connected between the switch common connection in the first of the pair of inverter legs and the switch common connection in the second of the pair of inverter legs; the improvement comprising:
   a protective circuit for each one of the pair of inverter legs, the protective circuit comprising:
      a protective capacitor;
      a blocking diode having its cathode connected in series with the protective capacitor, the protective capacitor and the blocking diode commonly connected together at a first common terminal, the series combination of the blocking diode and the protective capacitor connected across the anode of the switching device of the first of the pair of switch circuits and the cathode of the switching device of the second of the pair of switch circuits;
      a discharge resistor having a first resistor terminal connected to the first common terminal; and
      a choke having a first choke terminal connected to a second resistor terminal of the discharge resistor and a second choke terminal connected to the positive dc bus; and
   a snubber circuit for each one of the switch circuits, the snubber circuit comprising:
      a snubber capacitor;
      a snubber diode; and
      a snubber resistor connected in parallel with the snubber diode, the series combination of the snubber capacitor and the snubber diode connected across the switch circuit, the anode of the snubber diode connected to the anode of the switching device, whereby the protective capacitor charges to a voltage less than the peak allowable voltage of the switching devices, clamps voltage overshoots across the switching devices when the antiparallel diodes transition to reverse bias, and absorbs additional charge from the commutation capacitor when the load induction coil is at least partially short-circuited to increase the charge on the protective capacitor to a voltage less than the peak allowable voltage of the switching devices so that the voltage applied across a non-conducting switching device at the time of the short circuit is less than the peak allowable voltage of the non-conducting switching device.

11. A method of providing a fault tolerant power supply for an inductive load wherein the power supply comprises a power source having a dc output; an inverter leg comprising a pair of switch modules; each one of the switch modules comprising a di/dt reactor in series with a switch circuit; the switch circuit comprising a switching device connected anti-parallel to an antiparallel diode, the switch circuits in each one of the pair of switch modules connected together at a switch common connection, the inverter leg connected across the dc output of the power source; a pair of commutation capacitors connected in series combination across the dc output of the power source; the inductive load connected across the switch common connection and the common connection of the pair of commutation capacitors, the switching devices in each one of the pair of switch modules arranged in an inverse parallel configuration to provide ac power to the inductive load, the method comprising the steps of:
   charging a protective capacitor connected across the pair of switch circuits to a voltage less than the peak allowable voltage of the switching devices; and absorbing a charge from the pair of commutation capacitors to a voltage less than the peak allowable voltage of the switching devices when the inductive load is at least partially short-circuited.

12. The method of claim 11 further comprising the step of discharging the protective capacitor with a resistor connected across the protective capacitor.

13. The method of claim 11 further comprising the step of discharging the protective capacitor with a resistor connected between the protective capacitor and the positive dc bus of the dc output of the power source.

14. The method of claim 11 further comprising the step of clamping the voltage overshoots across the switching devices when the antiparallel diodes transition to reverse bias.

15. The method of claim 14 further comprising the step of discharging the protective capacitor with a resistor and a choke connected in series between the protective capacitor and the positive bus of the dc output of the power source.

16. A method of providing a fault tolerant power supply for an inductive load wherein the power supply comprises a power source having a dc output; a first and a second inverter leg, each one of the inverter legs comprising a pair of switch modules; each of the switch modules comprising a di/dt reactor in series with a switch circuit; the switch circuit comprising a switching device connected antiparallel to an antiparallel diode, the switch circuits in each one of the pair of switch modules in each one of the inverter legs connected together at a common switch connection, the first and the second inverter legs connected across the dc output of the power source; the inductive load connected in series with a commutation capacitor, the series combination of the inductive load and the commutation capacitor connected between the switch common connection in the first inverter leg and the switch common connection in the second inverter leg to provide ac power to the inductive load, the method comprising the steps of:

charging a first protective capacitor connected across the pair of switch circuits in the first inverter leg to a voltage less than the peak allowable voltage of the switching devices;

charging a second protective capacitor connected across the pair of switch circuits in the second inverter leg to a voltage less than the peak allowable voltage of the switching devices;

absorbing a charge in the first protective capacitor from the commutation capacitor to a voltage less than the peak allowable voltage of the switching devices when the inductive load is at least partially short-circuited; and absorbing a charge in the second protective capacitor from the commutation capacitor to a voltage less than the peak allowable voltage of the switching devices when the inductive load is at least partially short-circuited.

17. The method of claim 16 further comprising the step of discharging the protective capacitor with a resistor connected across the protective capacitor.

18. The method of claim 16 further comprising the step of discharging the protective capacitor with a resistor connected between the protective capacitor and the positive dc bus of the dc output of the power source.

19. The method of claim 16 further comprising the step of clamping the voltage overshoots across the switching devices when the antiparallel diodes transition to reverse bias.

20. The method of claim 19 further comprising the step of discharging the protective capacitor with a resistor and a choke connected in series between the protective capacitor and the positive bus of the dc output of the power source.

* * * * *